(12) United States Patent
Kunitomo

(10) Patent No.: US 10,581,437 B2
(45) Date of Patent: Mar. 3, 2020

(54) CRYSTAL CONTROLLED OSCILLATOR AND MANUFACTURING METHOD OF CRYSTAL CONTROLLED OSCILLATOR

(71) Applicant: NIHON DEMPA KOGYO CO., LTD., Tokyo (JP)

(72) Inventor: Hiroyasu Kunitomo, Saitama (JP)

(73) Assignee: NIHON DEMPA KOGYO CO., LTD., Tokyo (JP)

(\*) Notice: Subject to any disclaimer, the term of this patent is extended or adjusted under 35 U.S.C. 154(b) by 69 days.

(21) Appl. No.: 15/903,035

(22) Filed: Feb. 23, 2018

(65) Prior Publication Data
US 2018/0248556 A1 Aug. 30, 2018

(30) Foreign Application Priority Data

Feb. 27, 2017 (JP) ................. 2017-034834

(51) Int. Cl.
| | | |
|---|---|---|
| H03L 7/00 | (2006.01) | |
| H03B 1/02 | (2006.01) | |
| C30B 1/00 | (2006.01) | |
| H01L 21/56 | (2006.01) | |
| H01L 21/74 | (2006.01) | |
| H01L 21/82 | (2006.01) | |
| H03H 3/02 | (2006.01) | |
| H03H 9/05 | (2006.01) | |
| H01L 23/00 | (2006.01) | |
| H03H 9/10 | (2006.01) | |

(52) U.S. Cl.
CPC ............ *H03L 7/00* (2013.01); *C30B 1/00* (2013.01); *H01L 21/563* (2013.01); *H01L 21/743* (2013.01); *H01L 21/82* (2013.01); *H01L 24/11* (2013.01); *H01L 24/13* (2013.01); *H03B 1/02* (2013.01); *H03H 3/02* (2013.01); *H03H 9/0519* (2013.01); *H03H 9/0523* (2013.01); *H03H 9/0561* (2013.01); *H03H 9/1021* (2013.01); *H01L 2224/05087* (2013.01); *H01L 2224/11013* (2013.01); *H01L 2224/13025* (2013.01); *H01L 2224/13082* (2013.01); *H01L 2224/13101* (2013.01); *H01L 2224/13298* (2013.01); *H01L 2924/14* (2013.01); *H03B 2201/02* (2013.01); *H03H 2003/022* (2013.01)

(58) Field of Classification Search
CPC ........... H03H 9/1021; H03L 7/00; H03B 1/02
See application file for complete search history.

(56) References Cited

U.S. PATENT DOCUMENTS

| 8,004,160 B2* | 8/2011 | Tsuda .................... H03H 9/059 310/313 R |
| 2006/0244344 A1* | 11/2006 | Tanaka .................... H03B 5/36 310/344 |

FOREIGN PATENT DOCUMENTS

| JP | 2007251601 | 9/2007 |
| JP | 2010153941 | 7/2010 |
| JP | 2014033289 | 2/2014 |

(Continued)

*Primary Examiner* — Jeffrey M Shin
(74) *Attorney, Agent, or Firm* — JCIPRNET

(57) ABSTRACT

A crystal controlled oscillator includes a crystal unit, an integrated circuit, and an insulating resin. The crystal unit contains a crystal vibrating piece resonating at a predetermined frequency. The integrated circuit places the crystal unit. The integrated circuit includes an oscillator circuit oscillating the crystal vibrating piece. The insulating resin is formed to cover the crystal unit on the integrated circuit.

5 Claims, 9 Drawing Sheets

(56) References Cited

FOREIGN PATENT DOCUMENTS

| JP | 2015089084 | 5/2015 |
|---|---|---|
| JP | 2015095849 | 5/2015 |

\* cited by examiner

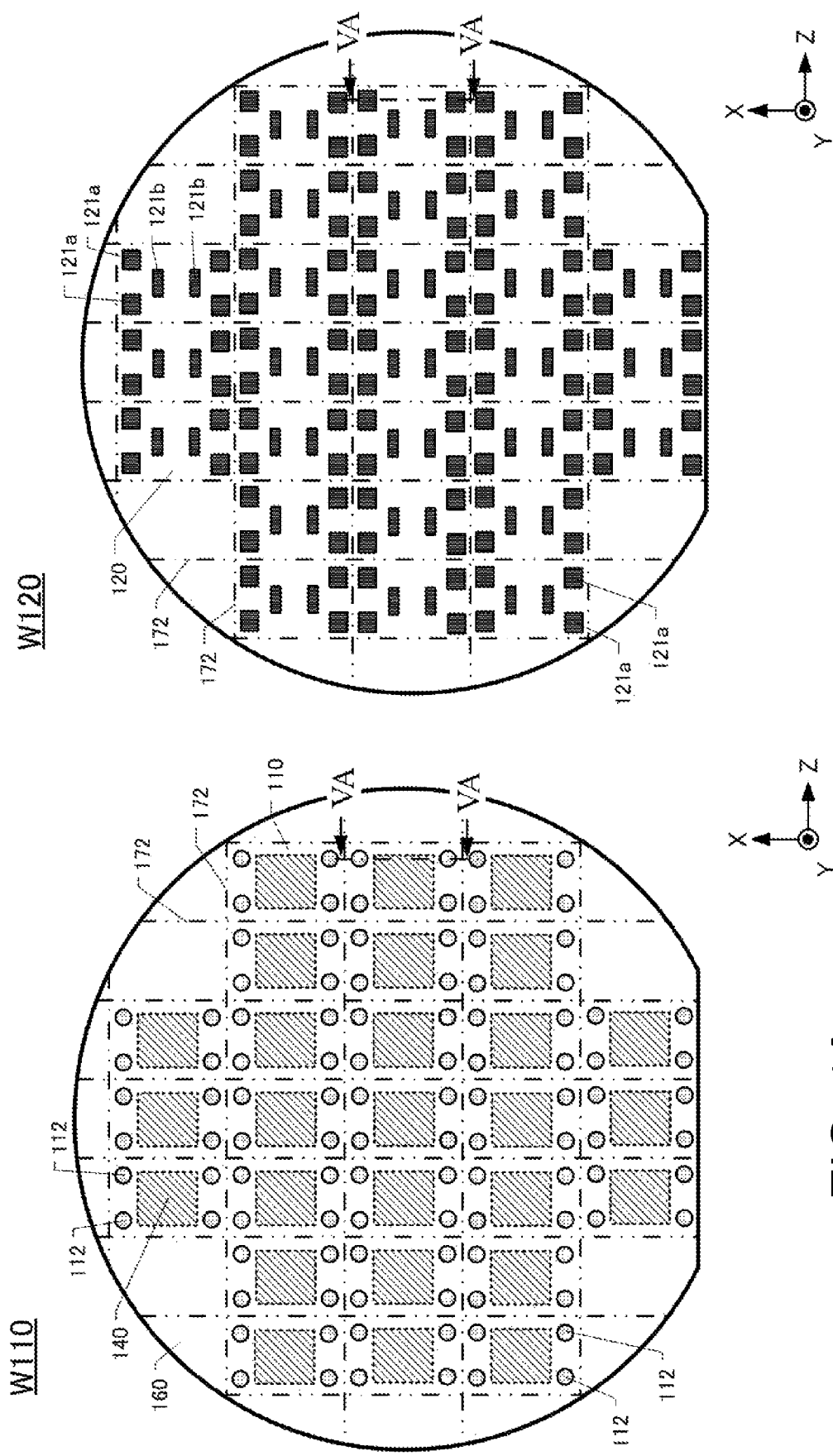

US 10,581,437 B2

CRYSTAL CONTROLLED OSCILLATOR AND MANUFACTURING METHOD OF CRYSTAL CONTROLLED OSCILLATOR

CROSS-REFERENCE TO RELATED APPLICATIONS

This application is based on and claims priority under 35 U.S.C. § 119 to Japanese Patent Application No. 2017-034834, filed on Feb. 27, 2017, the entire content of which is incorporated herein by reference.

TECHNICAL FIELD

The disclosure relates to a downsized crystal controlled oscillator and a manufacturing method of the crystal controlled oscillator.

DESCRIPTION OF THE RELATED ART

One of problems related to a crystal device is downsizing. Among the crystal device, a crystal controlled oscillator including an integrated circuit is behind in downsizing compared with a crystal unit that does not include an integrated circuit. Demand for a low price in the crystal controlled oscillator is particularly growing. Regarding this, Japanese Unexamined Patent Application Publication No. 2007-251601 provides disclosure that attempts to ensure downsizing and low price by placing a piezoelectric vibrating piece on a semiconductor wafer to cover it with a lid body substrate and then, separating it into individual pieces.

However, in a piezoelectric oscillator, a degree of difficulty of an assembly technique increases in accordance with downsizing. Thus, the manufacturing method of the piezoelectric oscillator disclosed in Japanese Unexamined Patent Application Publication No. 2007-251601 has problems that a development work period becomes longer and development costs increase, due to necessity to put a lot of manpower into development.

A need thus exists for a crystal controlled oscillator and a method for manufacturing the crystal controlled oscillator which are not susceptible to the drawback mentioned above.

SUMMARY

According to an aspect of this disclosure, there is provided a crystal controlled oscillator that includes a crystal unit, an integrated circuit, and an insulating resin. The crystal unit contains a crystal vibrating piece resonating at a predetermined frequency. The integrated circuit places the crystal unit. The integrated circuit includes an oscillator circuit oscillating the crystal vibrating piece. The insulating resin is formed to cover the crystal unit on the integrated circuit.

BRIEF DESCRIPTION OF THE DRAWINGS

The foregoing and additional features and characteristics of this disclosure will become more apparent from the following detailed description considered with reference to the accompanying drawings.

FIG. 4A is a plan view of a first substrate W110.

FIG. 4B is a plan view of a second substrate W120.

DETAILED DESCRIPTION

The following describes embodiments of the disclosure in detail with reference to the accompanying the drawings. It will be understood that the scope of the disclosure is not limited to the following embodiments.

First Embodiment

[Configuration of Crystal Controlled Oscillator 100]

Figure 1:
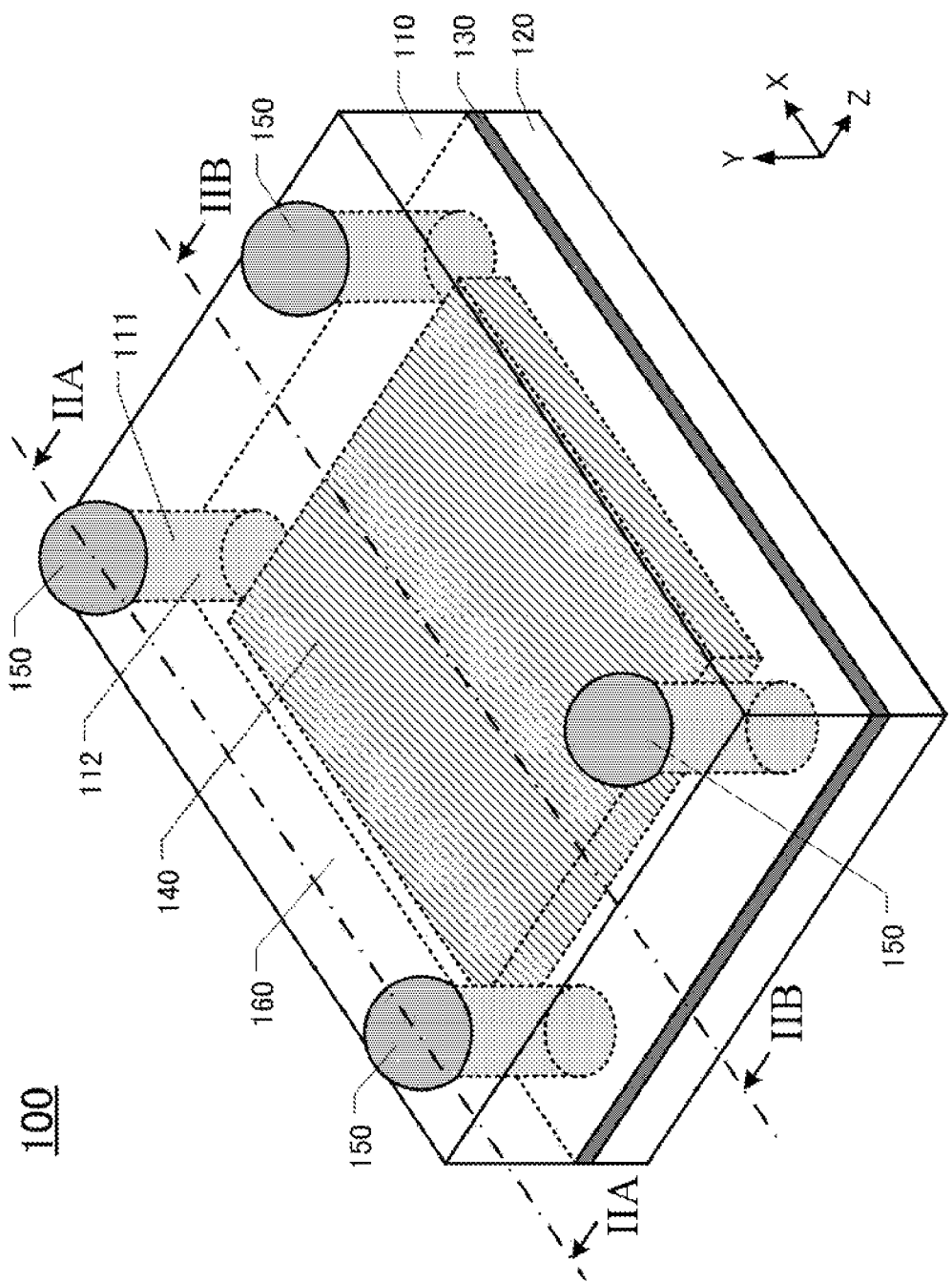
FIG. 1 is a perspective view of a crystal controlled oscillator 100.

FIG. 1 is a perspective view of the crystal controlled oscillator 100. The crystal controlled oscillator 100 includes a first layer 110 and a second layer 120, and the crystal controlled oscillator 100 is formed by bonding the first layer 110 and the second layer 120 with one another via a bonding material 130. The crystal controlled oscillator 100 has an outer shape formed in an approximately rectangular parallelepiped shape, for example. In the following, a description will be given by defining a direction where a long side of the crystal controlled oscillator 100 extends as an X-axis direction, a direction where a short side of the crystal controlled oscillator 100 extends as a Z-axis direction, and a direction perpendicular to a principle surface as a Y-axis direction.

The first layer 110 is formed mainly by a crystal unit 140 and an insulating resin 160, and the insulating resin 160 is formed to cover the crystal unit 140. In FIG. 1, the crystal unit 140, which is covered by the insulating resin 160, is indicated by a dotted line. In the first layer 110, vias 111, which are through holes penetrating the insulating resin 160 in a Y-axis direction, are formed at respective four corners of the first layer 110. In the respective vias 111, a conductive filler 112 is filled. On a surface on a +Y-axis side of the first layer 110 and on the +Y-axis side of the respective conductive fillers 112, solder balls 150 are formed so as to be electrically connected to the conductive filler 112. In the crystal controlled oscillator 100, the surface on the +Y-axis side is a mounting surface, which is a surface of a side where the crystal controlled oscillator 100 is mounted to a substrate or similar component, and the solder balls 150 are mounting terminals that are electrically connected to the substrate or similar component when the crystal controlled oscillator 100 is mounted to the substrate or similar component. The second layer 120 is an integrated circuit (IC) and includes an oscillator circuit for the crystal unit 140. The second layer 120 is formed of a semiconductor material such as silicon as a base material, for example.

Figure 2A:
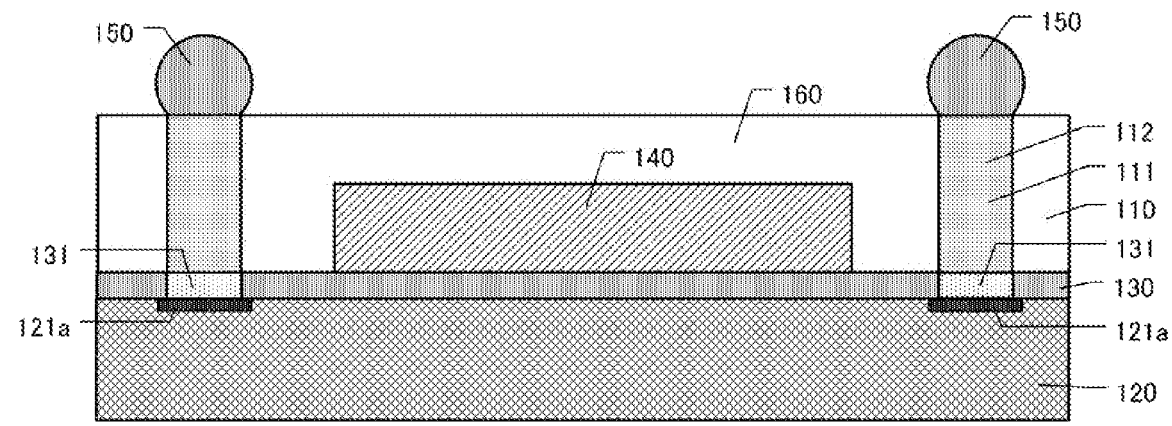
FIG. 2A is a cross-sectional view taken along the line IIA-IIA in FIG. 1.

FIG. 2A is a cross-sectional view taken along the line IIA-IIA in FIG. 1. In the crystal controlled oscillator 100, electrode pads 121a are formed in a surface on the +Y-axis side of the second layer 120. The electrode pad 121a is electrically connected to the conductive filler 112 filled in the via 111 of the first layer 110 via a bump 131. Thus, the electrode pad 121a is electrically connected to the solder ball 150.

Figure 2B:
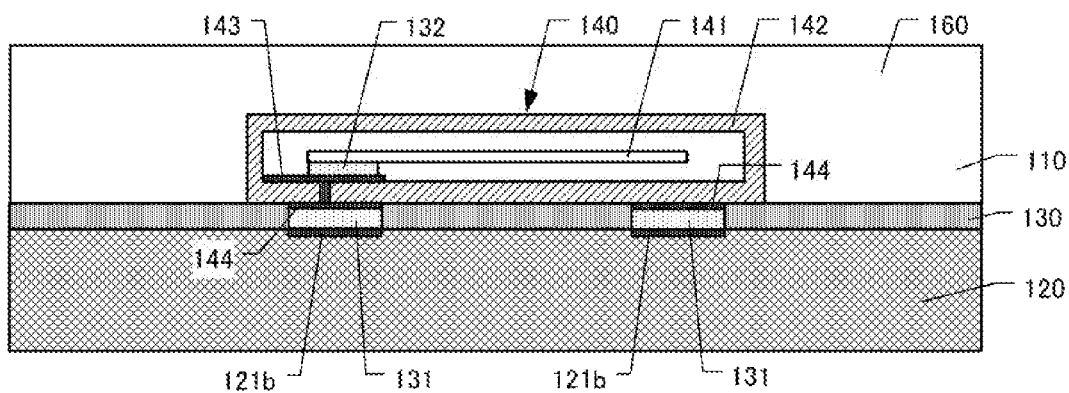
FIG. 2B is a cross-sectional view taken along the line IIB-IIB in FIG. 1.

FIG. 2B is a cross-sectional view taken along the line IIB-IIB in FIG. 1. The crystal unit 140 is formed with a crystal vibrating piece 141, which vibrates at a predetermined frequency and is sealed in a ceramic package 142, for example. The crystal vibrating piece 141 is secured and electrically connected to connection electrodes 143 formed inside the ceramic package 142 via conductive adhesives 132. The connection electrodes 143 are electrically connected to mounting electrodes 144 formed on an outside bottom surface on a −Y-axis side of the crystal unit 140. The mounting electrodes 144 are electrically connected to electrode pads 121b formed in the second layer 120 via the bumps 131.

[Manufacturing Method of Crystal Controlled Oscillator 100]

Figure 3:
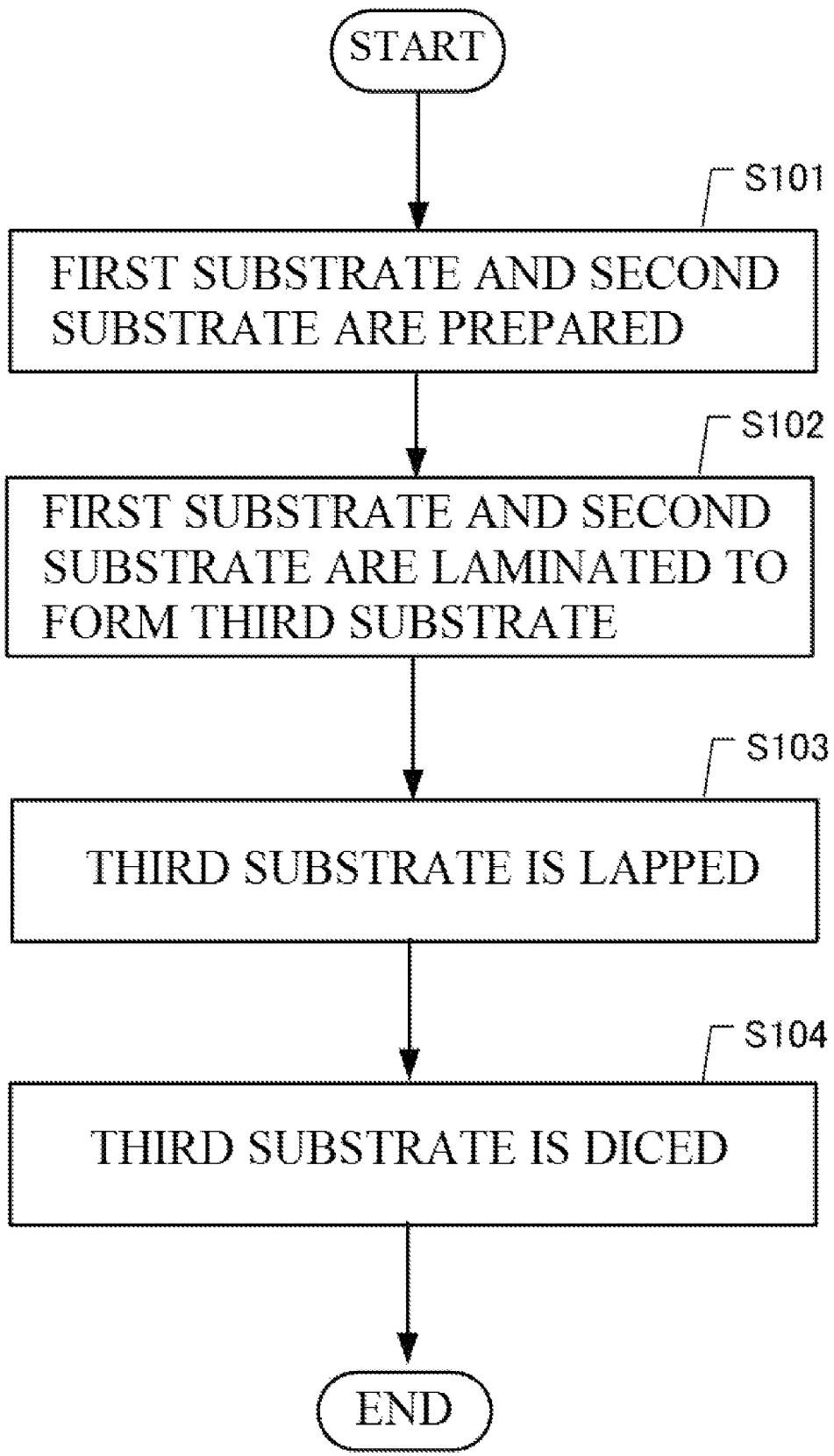
FIG. 3 is a flowchart illustrating a manufacturing method of the crystal controlled oscillator 100.

FIG. 3 is a flowchart illustrating the manufacturing method of the crystal controlled oscillator 100. FIG. 4A, FIG. 4B, FIG. 5A, and FIG. 5B illustrate the drawings for describing the flowchart in FIG. 3. FIG. 6 is a flowchart illustrating a manufacturing method of a first substrate W110. FIG. 7A, FIG. 7B, FIG. 8A, and FIG. 8B illustrate the drawings for describing the flowchart in FIG. 6. The following describes the manufacturing method of the crystal controlled oscillator 100 with reference to FIG. 3 to FIG. 8B.

At Step S101 in FIG. 3, the first substrate W110 and a second substrate W120 are prepared. The first substrate W110 and the second substrate W120 are formed as a wafer with an approximately identical planar shape and size. The wafer is formed in a size of 6 inches to 8 inches, for example. A process where the first substrate W110 is prepared is a "first substrate forming process", a process where the second substrate W120 is prepared is a "second substrate forming process", and the first substrate forming process and the second substrate forming process are mutually independent processes.

FIG. 4A is a plan view of the first substrate W110. FIG. 4A illustrates the first substrate W110 prepared in the first substrate forming process. FIG. 4A illustrates a plurality of crystal units 140 and conductive fillers 112 arranged in the first substrate W110. The first substrate W110 is formed with the crystal units 140 and the conductive fillers 112 secured to the solidified insulating resin 160. FIG. 4A illustrates scribe lines 172 that indicate portions to be diced in dicing at Step S104, which will be described later. The scribe lines 172 extend in the X-axis direction and the Z-axis direction. One of the first layers 110 is formed in the smallest region surrounded by the scribe lines 172.

FIG. 4B is a plan view of the second substrate W120. FIG. 4B illustrates the second substrate W120 prepared in the second substrate forming process. The second substrate W120 is formed of the semiconductor material such as silicon, for example. FIG. 4B illustrates the scribe lines 172, and the smallest regions surrounded by the scribe lines 172 are the second layers 120 of the crystal controlled oscillator 100. On the surface on the +Y-axis side in the region to be the respective second layers 120, the electrode pads 121a to be connected to the conductive fillers 112 and the electrode pads 121b to be electrically connected to the crystal unit 140 are formed.

At Step S102, the first substrate W110 and the second substrate W120 are laminated to form a third substrate W100. Step S102 is a "third substrate forming process". The first substrate W110 and the second substrate W120 are bonded by being mutually laminated via the bonding material 130.

Figure 5A:
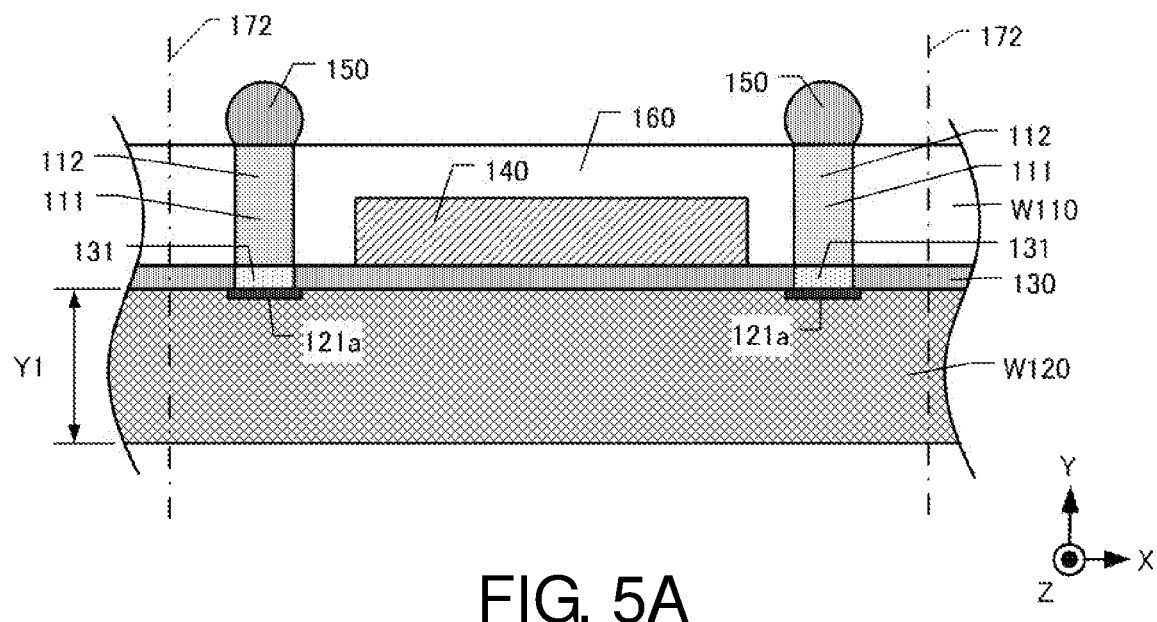
FIG. 5A is a partial cross-sectional view of a third substrate W100.
Figure 6:
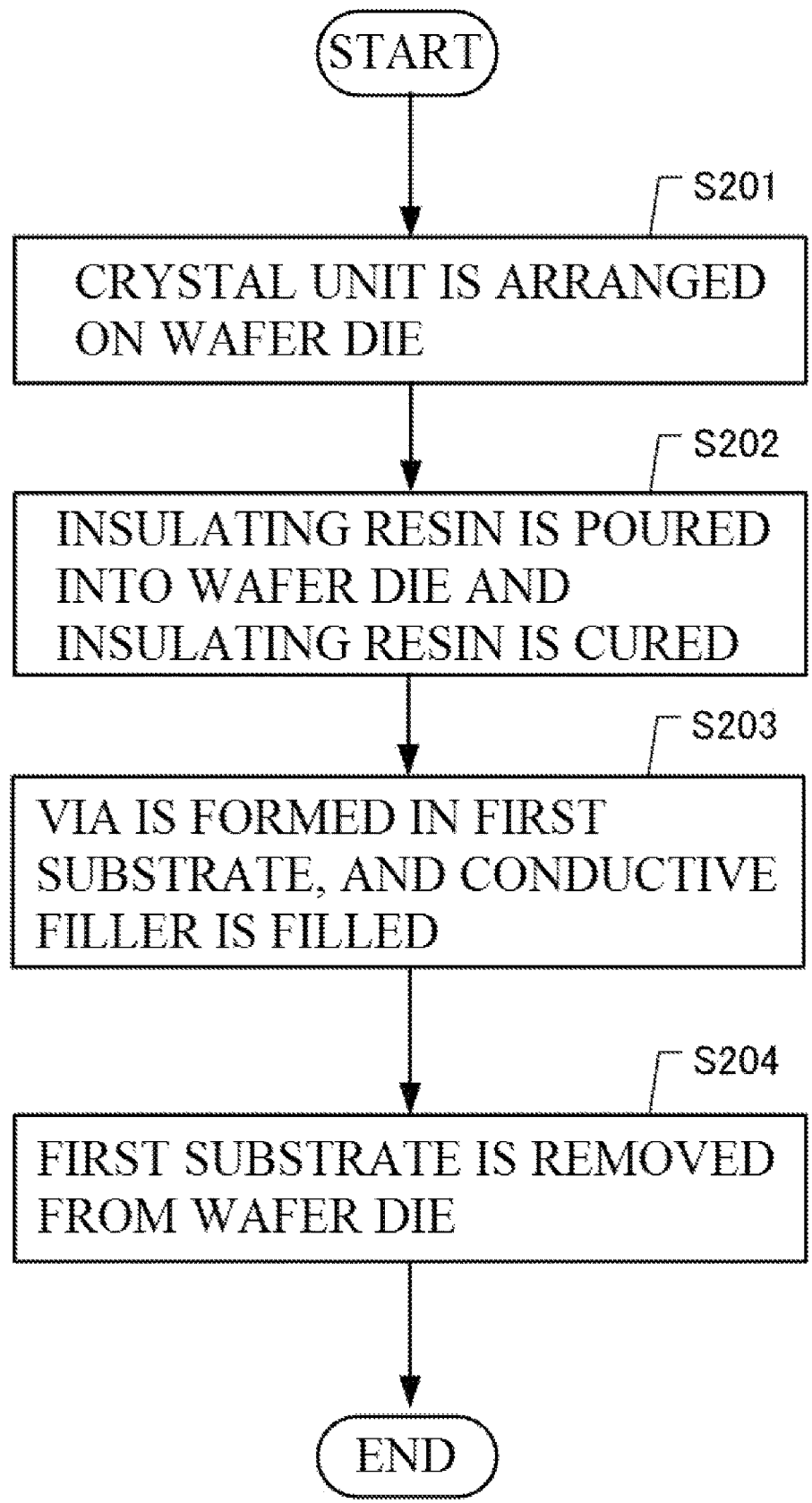
FIG. 6 is a flowchart illustrating a manufacturing method of a first substrate W110.

FIG. 5A is a partial cross-sectional view of the third substrate W100. FIG. 5A illustrates the positions of the scribe lines 172, and one of the crystal controlled oscillators 100 is formed in a region sandwiched by the scribe lines 172 adjacent with one another. The cross-sectional view of the third substrate W100 illustrated in FIG. 5A includes the cross-sectional view taken along the line VA-VA in FIG. 4A and the cross-sectional view taken along the line VA-VA in FIG. 4B. The first substrate W110 and the second substrate W120 are laminated via the bonding material 130. The conductive filler 112 and the electrode pad 121a are bonded by the bump 131, and the mounting electrode 144 (see FIG. 2B) and the electrode pad 121b (see FIG. 2B) are bonded by the bump 131.

For example, the first substrate W110 and the second substrate W120 are bonded with one another by forming a film of the bonding material 130 on the second substrate W120 and forming the bumps 131 after patterning of windows of the electrode pads 121a and the electrode pads 121b. In bonding, it is possible to employ a thermal curing method using a thermosetting bonding material as the bonding material 130, for example. For example, the first substrate W110 and the second substrate W120 are electrically bonded with one another by a method such as flip chip mounting with the bumps 131 such as gold bumps, and the solder balls 150 are formed on the surface on the +Y-axis side of the first substrate W110 after or before bonding of the first substrate W110 and the second substrate W120. At a time of Step S102, the second substrate W120 has a thickness of Y1.

At Step S103, the third substrate W100 is lapped. Step S103 is a "third substrate lapping process". At Step S103, the thickness of the third substrate W100 is adjusted by lapping the second substrate W120 side of the third substrate W100.

Figure 5B:
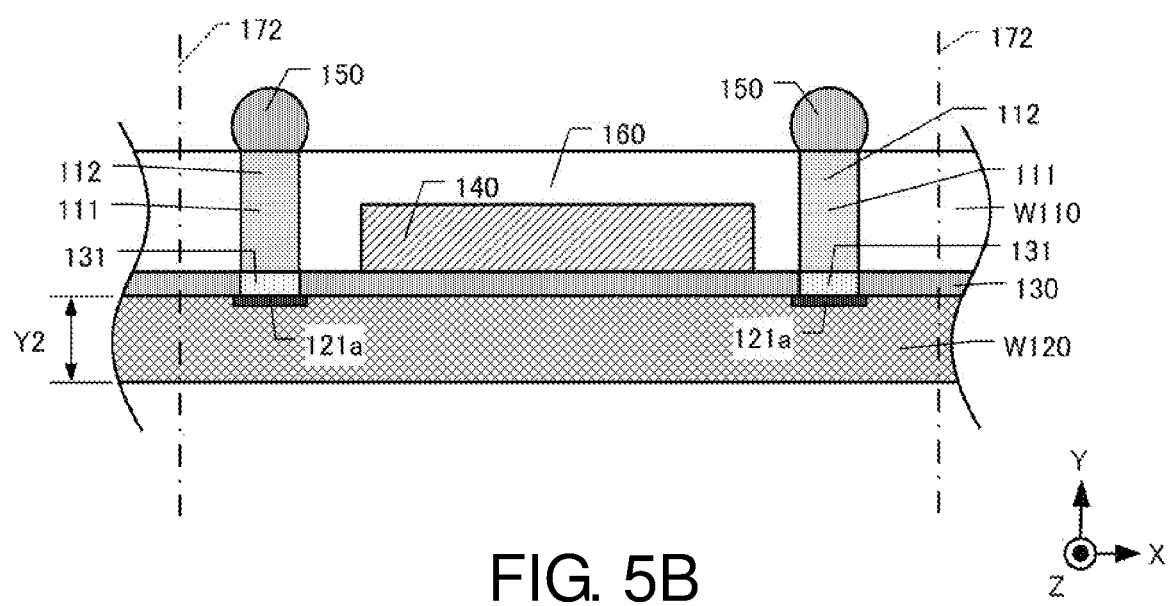
FIG. 5B is a partial cross-sectional view of the third substrate W100 after a third-substrate lapping process.

FIG. 5B is a partial cross-sectional view of the third substrate W100 after the third substrate lapping process. FIG. 5B illustrates a partial cross-sectional view of the portion identical to FIG. 5A. At Step S103, the thickness of the second substrate W120 and the thickness of the third substrate W100 are adjusted by lapping the third substrate W100. The lapped surface of the third substrate W100 is the surface on the −Y-axis side of the second substrate W120, the second substrate W120 is lapped to have a thickness of Y2. The thickness Y2 is a value smaller than the thickness Y1. The solder balls 150 may be formed after this lapping process.

At Step S104, the third substrate W100 is diced. The Step S104 is a "dicing process". At Step S104, the third substrate W100 is cut along the scribe lines 172, and thus, is divided into the individual crystal controlled oscillator 100.

[Manufacturing Method of First Substrate W110]

FIG. 6 is a flowchart illustrating the manufacturing method of the first substrate W110. FIG. 7A, FIG. 7B, FIG. 8A, and FIG. 8B illustrate the drawings for describing the flowchart in FIG. 6. The following describes the manufacturing method of the first substrate W110 prepared at Step S101 in FIG. 3 with reference to FIG. 6 to FIG. 8B.

At Step S201 in FIG. 6, the crystal units 140 are arranged on a wafer die 170. Step S201 is a "crystal unit arrangement process". The crystal units 140 are arranged at predetermined positions in the wafer die 170 to be an arrangement similar to the arrangement of the crystal units 140 in the first substrate W110 in FIG. 4A. The arranged crystal unit 140 is an already developed crystal unit such as a ready-made product.

Figure 7A:
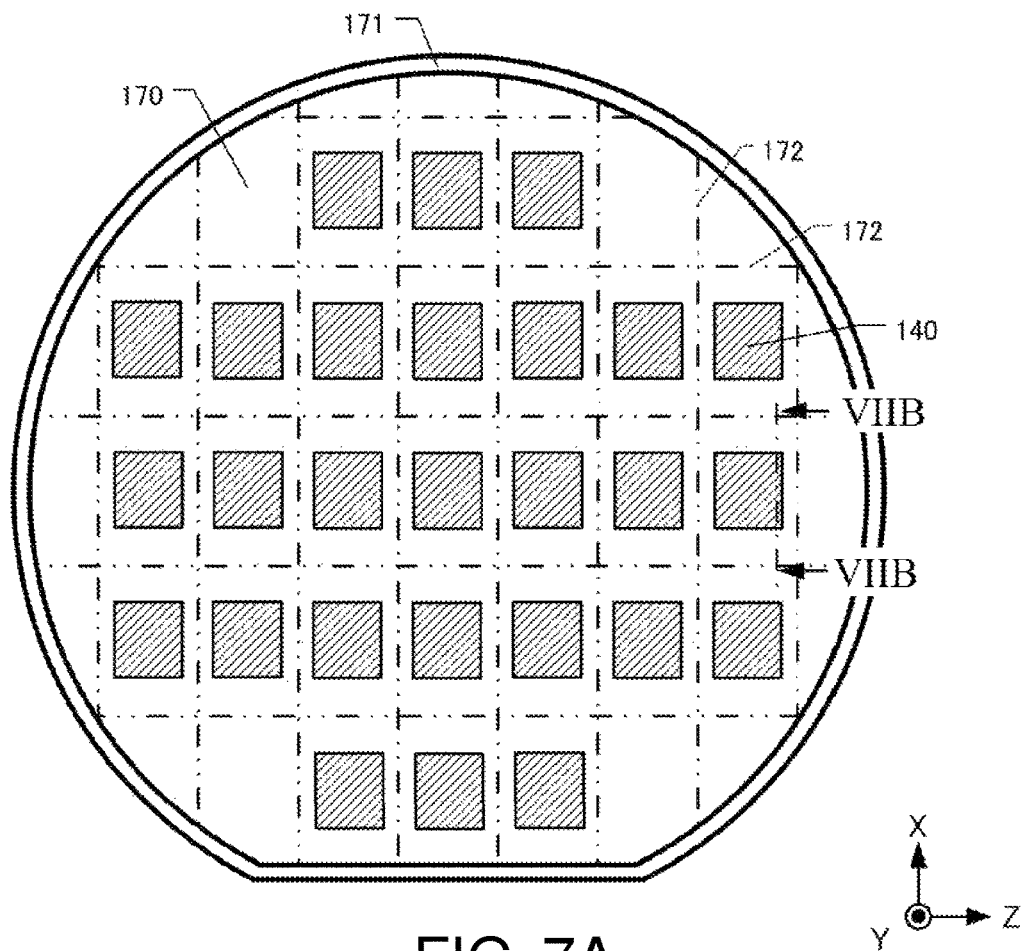
FIG. 7A is a schematic plan view of a wafer die 170 and crystal units 140 arranged on the wafer die 170.

FIG. 7A is a schematic plan view of the wafer die 170 and the crystal units 140 arranged on the wafer die 170. The wafer die 170 is formed with an outer shape having a shape and a size approximately identical to the shape and the size of the second substrate W120 so as to be easily bonded with the second substrate W120, for example. An edge 171, which is formed in the periphery of the wafer die 170, is raised in a convex shape, and thus, the insulating resin 160 can be poured in the wafer die 170 at Step S202, which will be described later. The wafer die 170 can be formed, for example, as follows: forming the wafer die 170 with a flexible material such that the first substrate W110 is easily removed from the wafer die 170; using a material with high thermal conductivity for the wafer die 170 when using a thermosetting material for the insulating resin 160; and forming the wafer die 170 with a material that transmits ultraviolet rays when using the insulating resin 160 of an ultraviolet curing type.

At Step S202, the insulating resin 160 is poured into the wafer die 170, and the insulating resin 160 is cured. Step S202 is an "insulation resin forming process". For the insulating resin 160, for example, a photocurable resin such as an ultraviolet curable resin, a thermosetting resin cured by heating, or similar resin can be used. The insulating resin 160 is poured into the wafer die 170 so as to cover the crystal units 140, and the insulating resin 160 is cured by a curing method that corresponds to the property of the insulating resin 160. Thus, the outer shape of the first substrate W110 is formed. The crystal units 140 do not have to be entirely covered with the insulating resin 160. That is, by halting pouring of the insulating resin 160 in a state where the surfaces on the +Y-axis side of the crystal units 140 are exposed, the insulating resin 160 may be cured in this state. This further ensures a low profile of the crystal controlled oscillator 100.

Figure 7B:
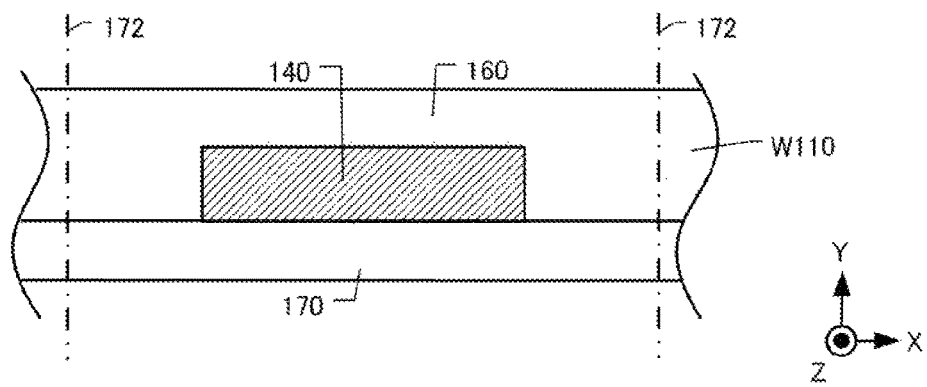
FIG. 7B is a schematic, partial cross-sectional view of the first substrate W110 formed on the wafer die 170.

FIG. 7B is a schematic, partial cross-sectional view of the first substrate W110 formed on the wafer die 170. FIG. 7B illustrates a cross-sectional view of the portion that corresponds to a cross-sectional view taken along the line VIIB-VIIB in FIG. 7A. The first substrate W110 is formed by forming the insulating resin 160 in an approximately constant thickness in the wafer die 170. As illustrated in FIG. 7B, the insulating resin 160 is formed so as to cover the crystal unit 140.

At Step S203, the vias 111 are formed in the first substrate W110, and the conductive fillers 112 are filled in the vias 111. Step S203 is a "via forming process and a conductive filler filling process". The vias 111 are formed by opening through holes to the cured insulating resin 160 by a drill or similar tool, for example. The vias 111 may be formed by a method such as etching. After formation of the vias 111, the conductive fillers 112 are filled in the vias 111.

Figure 8A:
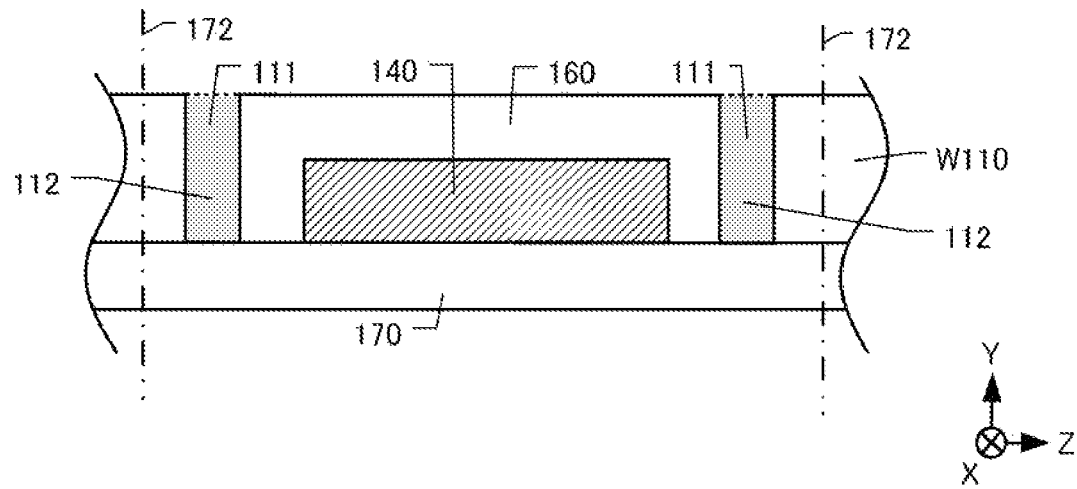
FIG. 8A is a schematic, partial cross-sectional view of the first substrate W110 where vias 111 are formed and a conductive filler 112 is filled.

FIG. 8A is a schematic, partial cross-sectional view of the first substrate W110 where the vias 111 are formed and the conductive fillers 112 are filled. FIG. 8A illustrates a cross-sectional view of the portion that corresponds to the cross-sectional view in FIG. 7B. The vias 111 are formed in parallel to the Y-axis, and formed at the positions that correspond to the electrode pads 121a (see FIG. 4B) of the second substrate W120. Filling the conductive filler 112 in the via 111 results in a state similar to a case where an electrode that penetrates the first substrate W110 in the Y-axis direction is formed.

At Step S204, the first substrate W110 is removed from the wafer die 170. Step S204 is a "first substrate removing process". Removing the first substrate W110 from the wafer die 170 results in formation of the independent first substrate W110.

Figure 8B:
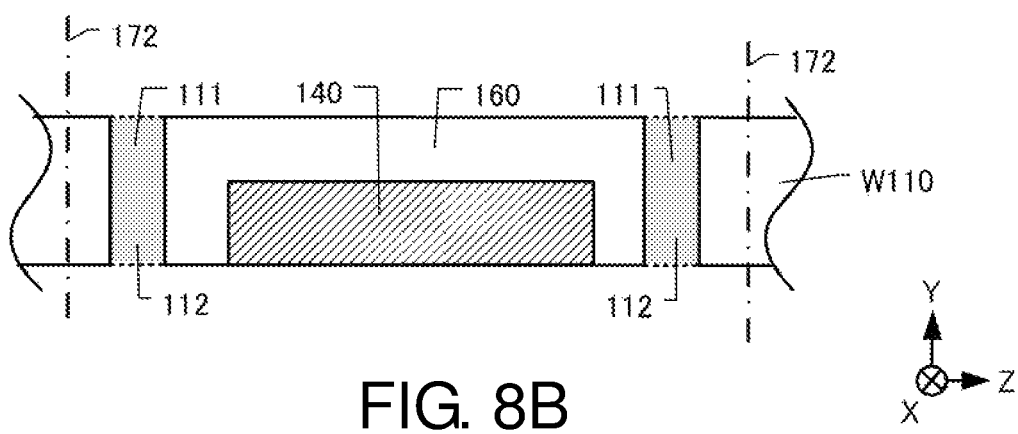
FIG. 8B is a schematic, partial cross-sectional view of the first substrate W110 that is removed from the wafer die 170.

FIG. 8B is a schematic, partial cross-sectional view of the first substrate W110 removed from the wafer die 170. The first substrate W110 removed from the wafer die 170 at Step S204 is the first substrate W110 prepared at Step S101 in FIG. 3. In the first substrate W110 illustrated in FIG. 8B, since the crystal unit 140 is in a state where the surface on the −Y-axis side is exposed, the crystal unit 140 can be electrically bonded with the second layer 120.

With the crystal controlled oscillator 100, as illustrated in FIG. 3 to FIG. 8B, a downsized crystal controlled oscillator can be mass produced by using a wafer-level-chip-size package (WL-CSP) technique that fabricates crystal controlled oscillators at a wafer level. This ensures the reduced manufacturing cost of a crystal controlled oscillator and thus ensures a low price of a crystal controlled oscillator.

New development of a crystal controlled oscillator requires not only a long development work period but also a lot of manpower for development, and this results in a problem of higher development costs. In contrast to this, the crystal controlled oscillator 100 directly uses the crystal unit 140, which has been already developed and commercialized, and thus, this ensures the reduced labor and cost required for development. By directly using the crystal unit 140, where performance as a product is already assured, a part of processes such as a frequency inspection, which is included in ordinary manufacturing processes of a crystal controlled oscillator, can be omitted in the manufacturing of the crystal controlled oscillator 100, and thus this facilitates manufacturing.

Second Embodiment

A crystal unit may be formed in various shapes. The following describes a modification of a crystal controlled oscillator where the surface on the −Y-axis side is the mounting surface.

[Configuration of Crystal Controlled Oscillator 200]

Figure 9:
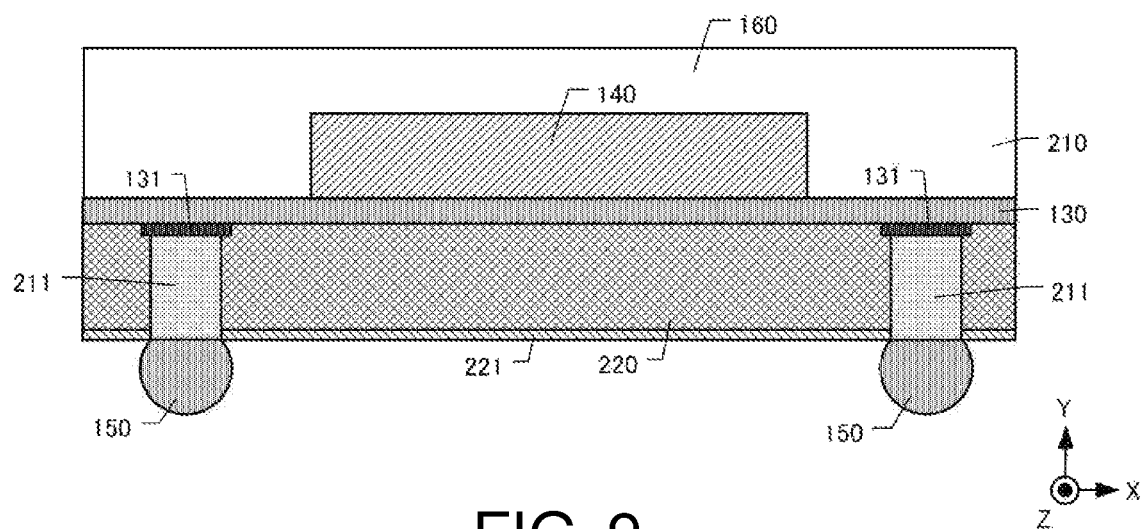
FIG. 9 is a schematic cross-sectional view of a crystal controlled oscillator 200.

FIG. 9 is a schematic cross-sectional view of a crystal controlled oscillator 200. The crystal controlled oscillator 200 is different from the crystal controlled oscillator 100 in that the surface on the −Y-axis side is formed to be the mounting surface. FIG. 9 is a cross-sectional view of the crystal controlled oscillator 200 in the portion that corresponds to FIG. 2A. The crystal controlled oscillator 200 is formed with a first layer 210 and a second layer 220 bonded with a bonding material. While the first layer 210 is formed with the crystal unit 140 covered with the insulating resin 160, the via 111 is not formed and the conductive filler 112 is not filled unlike the crystal controlled oscillator 100. In the second layer 220, silicon through electrodes (TSVs) 211, which penetrate the second layer 220 in the Y-axis direction, are formed. Further, in the second layer 220, an insulating layer 221 is formed on the surface of the −Y-axis side of the second layer 220, and solder balls 150 are formed so as to be electrically connected to the TSVs 211 in the second layer 220. In the crystal controlled oscillator 200, the surface on the −Y-axis side is the mounting surface.

As described above, while the preferred embodiments of this disclosure have been described in detail, it is apparent to those skilled in the art that various variations and modifications can be made within the scope of this disclosure. The above-described embodiments may be combined in various ways to be executed.

The crystal controlled oscillator of a second aspect according to the first aspect includes: a first layer that includes the crystal unit and the insulating resin; and a second layer formed with the integrated circuit. The first layer and the second layer are bonded with one another, the crystal unit is electrically connected to the second layer via a bump, and the first layer is bonded to the second layer by a bonding material formed between the first layer and the second layer.

The crystal controlled oscillator of a third aspect according to the second aspect is configured as follows. The insulating resin in the first layer includes a via that penetrates the insulating resin, the via is filled with a conductive filler electrically connected to an electrode pad formed in the second layer, and a surface of the insulating resin opposite to the second layer is formed with a solder ball electrically connected to the conductive filler.

The crystal controlled oscillator of a fourth aspect according to the first aspect to the third aspect is configured as follows. The crystal unit is formed with the crystal vibrating piece sealed in a ceramic package.

A method for manufacturing a crystal controlled oscillator of a fifth aspect includes: a crystal vibrating piece arranging step of arranging a plurality of crystal units on a wafer die, and each crystal unit containing a crystal vibrating piece resonating at a predetermined frequency; an insulating resin forming step of forming an insulating resin, by covering the plurality of crystal units arranged on the wafer die with the insulating resin and curing the insulating resin; a first substrate removing step of removing a first substrate formed by the plurality of crystal units and the insulating resin from the wafer die; a second substrate forming step of forming a second substrate including the plurality of integrated circuits, and each integrated circuit including the oscillator circuit that oscillates the crystal vibrating piece; a third substrate forming step of forming a third substrate by laminating the first substrate and the second substrate; and a third substrate dicing step of dicing the third substrate to form crystal controlled oscillators.

The method for manufacturing the crystal controlled oscillator of a sixth aspect according to the fifth aspect is configured as follows. The third substrate forming step includes: flip chip mounting of the first substrate onto the second substrate, and forming a bonding material between the first substrate and the second substrate to laminate the first substrate and the second substrate.

The method for manufacturing the crystal controlled oscillator of a seventh aspect according to the fifth aspect and the sixth aspect includes: a third substrate lapping step of lapping the third substrate for adjusting a thickness of the third substrate by lapping a side of the second substrate of the third substrate, after forming the third substrate.

The method for manufacturing a crystal controlled oscillator of an eighth aspect according to the fifth aspect to the seventh aspect includes: a via forming step of forming a plurality of vias penetrating the insulating resin, after the forming the insulating resin; and a conductive filler filling step of filling a conductive filler into the vias after forming the vias. The third substrate forming step includes: electrically connects an electrode pad of the second substrate to the conductive filler, and forming a solder ball electrically connected to the conductive filler on a surface of the first substrate opposite to the second substrate.

With the crystal controlled oscillator and the manufacturing method of the crystal controlled oscillator according to this disclosure ensure not only downsizing and low price but also facilitated development.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A crystal controlled oscillator, comprising:
   a crystal unit that contains a crystal vibrating piece resonating at a predetermined frequency;
   an integrated circuit that places the crystal unit, the integrated circuit including an oscillator circuit oscillating the crystal vibrating piece; and
   an insulating resin, formed to cover the crystal unit on the integrated circuit;
   wherein the crystal controlled oscillator comprises:
      a first layer that includes the crystal unit and the insulating resin; and
      a second layer formed with the integrated circuit,
   wherein the first layer and the second layer are bonded with one another, and
   the crystal unit is electrically connected to the second layer via a bump, and the first layer is bonded to the second layer by a bonding material formed between the first layer and the second layer;
   wherein the insulating resin in the first layer includes a via that penetrates the insulating resin,
   the via is filled with a conductive filler electrically connected to an electrode pad formed in the second layer, and
   a surface of the insulating resin opposite to the second layer is formed with a solder ball electrically connected to the conductive filler.

2. The crystal controlled oscillator according to claim 1, wherein
   the crystal unit is formed with the crystal vibrating piece sealed in a ceramic package.

3. A method for manufacturing a crystal controlled oscillator, comprising:
   arranging a plurality of crystal units on a wafer die, and each crystal unit containing a crystal vibrating piece resonating at a predetermined frequency;
   forming an insulating resin, by covering the plurality of crystal units arranged on the wafer die with the insulating resin and curing the insulating resin;
   forming a plurality of vias penetrating the insulating resin;
   filling a conductive filler into the vias;
   removing a first substrate formed by the plurality of crystal units and the insulating resin from the wafer die;
   forming a second substrate including a plurality of integrated circuits, and each integrated circuit including the oscillator circuit that oscillates the crystal vibrating piece;

forming a third substrate by laminating the first substrate and the second substrate; and dicing the third substrate to form crystal controlled oscillators;

wherein in the step of forming the third substrate, an electrode pad of the second substrate is electrically connected to the conductive filler, and a solder ball electrically connected to the conductive filler is formed on a surface of the first substrate opposite to the second substrate.

4. The method for manufacturing a crystal controlled oscillator according to claim 3, wherein forming the third substrate includes:

flip chip mounting of the first substrate onto the second substrate, and forming a bonding material between the first substrate and the second substrate to laminate the first substrate and the second substrate.

5. The method for manufacturing a crystal controlled oscillator according to claim 3, further comprising:

lapping the third substrate for adjusting a thickness of the third substrate by lapping a side of the second substrate of the third substrate, after forming the third substrate.

* * * * *